United States Patent [19]
Tanaka et al.

[11] Patent Number: 5,097,318
[45] Date of Patent: Mar. 17, 1992

[54] SEMICONDUCTOR PACKAGE AND COMPUTER USING IT

[75] Inventors: Akira Tanaka, Katsuta; Kazuji Yamada, Hitachi; Hirokazu Inoue, Ibaraki; Hideo Arakawa; Masahide Okamoto, both of Hitachi, all of Japan

[73] Assignee: Hitachi, Ltd., Tokyo, Japan

[21] Appl. No.: 331,802

[22] Filed: Apr. 3, 1989

[30] Foreign Application Priority Data

Apr. 4, 1988 [JP] Japan ................... 63-81258

[51] Int. Cl.⁵ ................. H01L 23/12; H01L 21/82
[52] U.S. Cl. ...................... 357/74; 357/80; 357/81
[58] Field of Search ............... 357/72, 74, 80, 81

[56] References Cited

U.S. PATENT DOCUMENTS

| | | | |
|---|---|---|---|
| 4,513,355 | 4/1985 | Schroeder et al. | 357/74 |
| 4,608,592 | 8/1986 | Miyamoto | 357/74 |
| 4,630,096 | 12/1986 | Drye et al. | 357/74 |
| 4,649,417 | 3/1987 | Burgess et al. | 357/74 |
| 4,695,870 | 9/1987 | Patraw | 357/74 |
| 4,724,472 | 2/1988 | Sugimoto et al. | |
| 4,807,019 | 2/1989 | Tustaniwskyj | 357/74 |
| 4,827,327 | 5/1989 | Miyauchi et al. | 357/74 |
| 4,866,507 | 9/1989 | Jacobs et al. | 357/74 |
| 4,868,638 | 9/1989 | Hirata et al. | 357/74 |

FOREIGN PATENT DOCUMENTS

| | | |
|---|---|---|
| 57-32661 | 2/1982 | Japan . |
| 57-85244 | 5/1982 | Japan . |
| 125641 | 7/1984 | Japan . |
| 60-92644 | 5/1985 | Japan ................... 357/74 |
| 60-239044 | 11/1985 | Japan . |
| 60-246656 | 12/1985 | Japan . |
| 263450 | 12/1985 | Japan . |
| 263451 | 12/1985 | Japan . |
| 6846 | 1/1986 | Japan . |
| 21251 | 1/1987 | Japan ................... 357/74 |
| 62-261129 | 11/1987 | Japan . |
| 89350 | 4/1989 | Japan . |

OTHER PUBLICATIONS

Cicone et al., "Silicon Integrated High Performance Package", vol. 27, No. 7B, Dec./84, p. 4226.
"Common Substrate Design for Wirebond/Hermetic VLSI Devices", IBM TDB, vol. 27, No. 11, Apr./85, p. 6366.
"Silicon Integrated High Performance Package", IBM TDB, vol. 27, No. 7B, Dec./84, p. 4226.

Primary Examiner—Andrew J. James
Assistant Examiner—Viet Q. Nguyen
Attorney, Agent, or Firm—Antonelli, Terry, Stout & Kraus

[57] ABSTRACT

A cavity-down type package for a semiconductor device comprises an insulating base substrate on which the semiconductor device and another insulating cap substrate with plural outer connection terminals on its outer surface and with electrodes provided on conductive layers for electric conduction on its inner surface. The electrodes on the insulating base substrate and those on the insulating cap substrate are connected with each other by using conductive material such as bumps.

8 Claims, 5 Drawing Sheets

SEMICONDUCTOR PACKAGE AND COMPUTER USING IT

BACKGROUND OF THE INVENTION

The present invention relates to a package structure incorporating a semiconductor device.

In recent years, high-density high integration semiconductor integrated circuits have been developed. Correspondingly, an LSI chip to be used has been remarkably large-scaled. Also, its heat density has been increasingly enhanced. To deal, with such a situation, there has been widely used a pin-grid-array package in which a great number of terminals for outer connection are arranged in a matrix shape on one surface of a package substrate.

Figure 2:
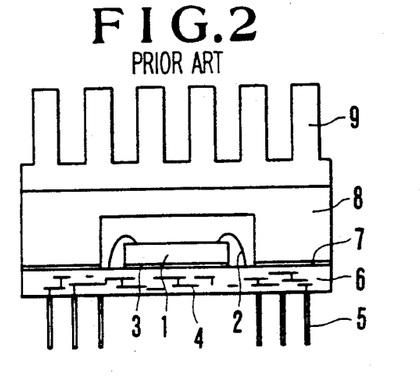
FIGS. 2 and 3 are a sectional view of the prior art semiconductor package respectively.
Figures 3, 4A, 4B, 4C:
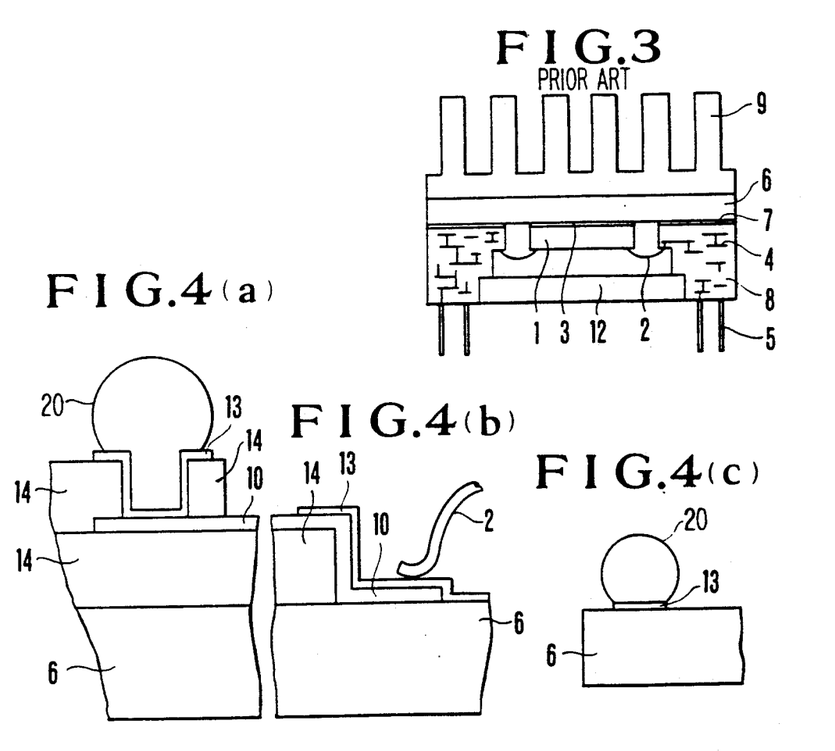
FIGS. 4a, 4b and 4c are a sectional view showing the details of electrode part of the semiconductor package of the present invention, of wire-bonding part thereof and sealing part thereof, respectively.

A general structure of the pin-grid-array package is roughly classified in two types, i.e. "cavity-up" type and "cavity-down" type in view of manner of incorporating a chip. The cavity-up type is a structure as shown in FIG. 2 in which a chip carrier incorporating the chip looks up. The cavity-down type is a structure as shown in FIG. 3 in which a chip carrier incorporating the chip looks down.

Referring to FIG. 2, the structure of the cavity-up type package will be explained below. A chip 1 is fixedly attached to an insulating base substrate 6 through a fixing layer 3. Electric connection is made from the chip 1 to electrode part (not shown) on the insulating base substrate 6 through e.g. wire bondings 2, and further to pin-like terminals 5 for outer connection through conductive layers 4 in the insulating base substrate 6. Although in FIG. 2, wirings are extended in the substrate using a multi-layer plate as the insulating base substrate, they may also be extended by means of thin films and the like provided on the insulating base substrate 6 so as to be connected with the outer connection terminals 5 through conductive parts vertically provided within the insulating base substrate 6. Airtightness of the package is important from the viewpoint of reliability in the correct operation of the LSI chip, etc. In order to assure the airtightness of the package, the insulating base substrate 6 on which the chip is mounted is sealed by an insulating cap substrate 8 using e.g. soldering so as to shut out the outer environment. In the package having such a structure as mentioned above, heat generated in the chip 1 propagates to the insulating base substrate 6 through the chip fixing layer 3. The package is inserted and fixed onto a printed board through the outer connection terminal pins 5. In this case, the distance between the base substrate 6 and the printed board is as short as several millimeters. Thus, compulsory cooling from below the base substrate provides only slight effect. Accordingly, heat spreads in the insulating base substrate 6 and propagates to the insulating cap substrate 8 via a package sealing layer 7. And the heat propagates to a fin 9 fixed to the insulating base substrate 6 and is radiated therefrom.

Explanation will be given for the structure of the cavity-down type package of FIG. 3. The chip 1 is fixedly attached to the insulating base substrate 6. Electric connection is made from the chip 1 to electric part (not shown) on the insulating cap substrate 8 through e.g. wire bondings 2, and further to the pin-like terminals 5 for outer connection through the conductive layers 4 in the insulating cap substrate 6. In order to assure the airtightness of the package, the insulating cap substrate 8 incorporating the conductive layers 4 is sealed by a sealing cap 12 using e.g. soldering. In the package having such a structure, heat generated in the chip 1 propagates to the insulating base substrate 6 through chip fixing layer 3. And the heat spreads in the insulating base substrate 6 and propagates to the fin 9 fixed thereto thereby to be radiated therefrom.

In recent years, there has been proposed a structure in which a multi-layer is not used in the insulating cap substrate to extend the wirings, as disclosed in JP-A-62-106635. In this structure, the wirings are extended on the insulating base substrate on which the chip is mounted and outer connection terminal pins are provided on the ends of the wirings. An insulating cap substrate having a large number of through-holes is also prepared. The outer connection terminal pins on the insulating base substrate are fit into the through-holes of the insulating cap substrate. And the insulating base substrate is sealed in its periphery and also the through-holes through which the outer connection terminal pins are passed are sealed with soldering, resin, etc.

Further, there is proposed in JP-A-62-9649 a structure in which a wiring layer is formed in the substrate on which a semiconductor chip is mounted and a cap for sealing the semiconductor chip traverses the wiring layer. In this structure, the wiring layer is partially sealed by the cap but not entirely covered with the cap so that it must be covered with other means.

The semiconductor device package structures as mentioned above have the following problems to be solved.

The cavity-up type structure has a defect of a long heat propagation path. Heat generated in the chip must pass the long heat propagation path consisting of the chip fixing layer 3, the insulating base substrate 6, the package sealing layer 7, the insulating cap substrate 8 and the fin 9. Thus, the cavity-up type package structure is poor in its cooling efficiency and large in its heat resistance. This make it difficult to incorporate, in the package structure, a chip which has been very highly densified or integrated in recent years to have a high heat generation density.

On the other hand, in the cavity-down type package structure as shown in FIG. 3, heat generated in the chip is radiated via the chip fixing layer 3, the insulating base substrate 6 and the fin 9. Thus, the heat propagation path consisting of the sealing layer and the cap is omitted so that the heat propagation path in the cavity-down structure is shorter than that in the cavity-up structure. Therefore, the cavity-down structure is more advantageous than the cavity-up structure with respect to their cooling efficiency.

However, the cavity-down package structure also has the following disadvantages.

First, the cavity-down structure becomes complicated in its structure. Since the chip looks down, the electric connection from the chip to the outer connection terminal pins 5 is more complicated than the cavity-up structure. Also, since the chip and the outer connection terminals are located on the same side, it is difficult to make the wire bonding, which requires some particular contrivance in assembling the package. Further, since in view of the structure, the wire bonding is made directly from the chip onto the cap substrate, in order to extend the wiring, the cap substrate must be constructed in a multi-layer structure. Moreover, since the outer connection terminal pins 5 can not be provided on the cap 12 for holding the airtightness of the package, the area where the outer connection terminal pins can be arranged is smaller than the cavity-down package structure.

Secondly, the cavity-down structure provides reduced transmission speed due to its complicated structure. The transmission speed is reduced as the permittivity is increased. Thus, the conventional cavity-down structure, where transmissions travels a relatively long path of ceramic that has a larger permittivity than plastic, is inferior to the cavity-up structure in its transmission characteristic. Therefore, the conventional cavity-down structure can not sufficiently satisfy the increasing demand for high speed transmission experienced in recent years.

The cavity-down structure proposed in the above JP-A-62-106635, which seemed to provide a transmission speed substantially equal to the cavity-up structure, has the disadvantages of complicated steps of passing the outer connection terminal pins through the through-holes and thereafter sealing the through-holes. Further, the structure proposed in the above JP-A-62-9649 has a problem that the wiring layer is not entirely covered with the cap.

SUMMARY OF THE INVENTION

One object of the present invention is to provide a package for a semiconductor device which is free from the above problems, permits a chip producing a large amount of heat to be mounted and has a high transmission speed characteristic.

Another object of the present invention is to provide a ceramic cap for a semiconductor package which can hermetically seal a semiconductor device and permits outer connection terminals to be provided.

Still another object of the present invention is to provide a substrate for a semiconductor package which can reduce a propagation delay-time.

A further object of the present invention is to provide a computer which can perform a high speed processing.

In order to attain the above one object, in accordance with the present invention, there is provided a package for a semiconductor device (referred to as a semiconductor package) comprising a insulating base substrate on which a semiconductor device is mounted and an insulating cap substrate with plural outer connection terminals on its one surface and with electrodes provided on conductive layers for electric connection on its inner surface wherein electrodes on the insulating base substrate and electrodes on the insulating cap substrate are connected with each other by means of conductive material such as bumps.

Further, there is provided a semiconductor package comprising an insulating substrate on which a semiconductor device is mounted and wiring layers are provided, and an insulating cap for hermetically sealing the semiconductor device and the wiring layers from the open air, wherein said wiring layers have electrodes to be connected with outer connection terminals and a plurality columns of the electrodes are arranged regularly in the entire outer periphery of the semiconductor device.

Moreover, there is provided a semiconductor package comprising a wiring layer having plural conductive layers with different lengths regularly arranged wherein a plurality of columns of these plural conductive layers are arranged regularly or an insulating cap has outer connection terminals on its outer surface which are connected with outer connection pins.

In order to attain the above another object of the present invention, there is provided a ceramic cap for a semiconductor package, made of sinter, for sealing a semiconductor device, wherein the cap has conductive layers formed in through-holes by conductive paste In addition to the conductive layers, the cap has outer connection pins connected with outer connection terminals of the conductive layers.

In order to attain the above still another object of the present invention, there is provided a substrate for a semiconductor package, made of sintered ceramic, on which a semiconductor device is mounted, wherein the substrate has plural wiring layers with different wiring lengths regularly arranged at regular intervals and a plurality of columns of these plural wiring layers are arranged regularly. Further, there is provided a substrate for a semiconductor package, wherein the substrate has wiring layers, the wiring layers have electrodes to be connected with outer connection terminals and a plurality of columns of the electrodes are arranged regularly on the entire outer periphery of the semiconductor device. Moreover, there is provided a substrate for a semiconductor package, wherein wiring layers are provided on a resin layer the wiring layers have electrodes to be connected with outer connection terminals and a plurality of columns of the electrodes are arranged regularly on the entire outer periphery of the semiconductor device.

In order to attain the above further object of the present invention, there is provided a computer comprising a platter, a multi-layer printed circuit board and a semiconductor package for logic and another semiconductor package for main storage which are mounted on the circuit board, wherein at least one of the semiconductor packages has an insulating substrate on which a semiconductor device is mounted and wiring layers are provided and an insulating cap for hermetically sealing the semiconductor device and the wiring layers from the open air; the cap has, on its outer surface, outer connection terminals and, on its internal surface, electrodes provided on conductive layers electrically connected with the outer connection terminals; and electrodes of said wiring layers are connected with the electrodes on the internal surface of the cap by means of conductive material.

In accordance with the present invention, in a semiconductor package comprising an insulating base substrate on which a semiconductor device is mounted and an insulating cap substrate with plural outer connection terminals on its one surface and with electrodes provided on conductive layers for electric connection on its inner surface, electrodes on the insulating base substrate and electrodes on the insulating cap substrate are connected with each other by means of conductive material such as bumps. Thus, although it is a cavity-down structure, it is possible to adopt the insulating cap substrate in such a simple structure as conductive layers are provided vertically to the cap substrate. Further, the insulating cap substrate need not be in a multi-layer. Thus, if the cap substrate is made of material having a large permittivity such as ceramic, the propagation path therethrough is limited to the minimum, thereby permitting delay of the propagation time to be minimized. Moreover, in a manufacturing process, the insulating cap substrate previously provided with outer connection terminal pins is aligned in the ordinary manner to be connected with the insulating base layer. Therefore, the present invention can be realized with the same operability as in the cavity-up type structure.

As a connection method using a solder bump, the CCB (controlled collapse bonding) is proposed in U.S. Pat. No. 3429040. This method permits the connection to be made in a ball shape held in a certain size so that fused solder does not flows out.

Again, in accordance with the present invention, in a semiconductor package comprising an insulating base substrate on which a semiconductor device is mounted and an insulating cap substrate with plural outer connection terminals on its one surface and with electrodes provided on conductive layers for electric connection on its inner surface, electrodes on the insulating base substrate and electrodes on the insulating cap substrate are connected with each other by means of conductive material. Therefore, the semiconductor package of the present invention provides as excellent heat radiating property, and also provides improved transmission characteristic since the structure of the insulating cap substrate is simplified to decrease the distance travelling a path having a comparatively large permittivity thereby to reduce the propagation delay time. Further, if the cap substrate and the base substrate are made of the seam material, a semiconductor package with high reliability is obtained.

Further, the ceramic cap for a semiconductor package in accordance with the present invention permits a semiconductor device to be sealed and outer connection terminals to be provided.

Moreover, the substrate for a semiconductor package in accordance with the present invention, because of the absence of a ceramic multi-layer plate, permits wirings to be formed on its ceramic surface so as to shorten the length of the wiring layers, thereby reducing the delay time.

Furthermore, if passive elements are incorporated in the cap substrate, abrupt voltage variation in the neighborhood of a semiconductor device chip can be reduced and also the wiring length of the circuit can be made smaller than the conventional structure in which capacitors are connected externally of the package. Thus, in accordance with the present invention, the quality of the transmission waveform can be improved and the transmission time can be reduced.

Finally, the computer in accordance with the present invention permits a higher speed processing to be performed because of reduced propagation delay time and a high efficiency processing to be performed in bank terminals in which intermediate computers are used.

DESCRIPTION OF THE PREFERRED EMBODIMENTS

The present invention will be explained in connection with several embodiments shown in the drawings.

EMBODIMENT 1

Figure 1:
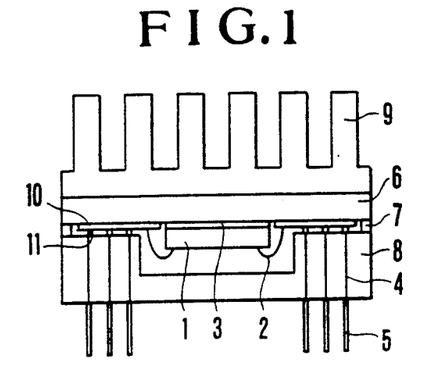
FIG. 1 is a sectional view of one embodiment of a semiconductor package in accordance with the present invention.

FIG. 1 is a sectional view of a first embodiment of the semiconductor package in accordance with the present invention. As seen from FIG. 1, the semiconductor package of the first embodiment is constructed in a cavity-down structure. In FIG. 1, a chip 1 is fixedly attached to an insulating base substrate 6. The insulating base substrate 6 and an insulating cap substrate 8 are made of sintered aluminum nitride (AlN). The thermal expansion coefficient of AlN, which is $3.4 \times 10^{-6}/°C.$, is nearly equal to that of silicon which is a material of the chip 1. Therefore, the substrate 6 and 8 can be connected with the chip 1 with high reliability. The thermal conduction coefficient of AlN is as comparatively large as 150 w/m·k. Thus, the heat generated in the chip 1 can be sufficiently conducted to a fin 9 which is made of metal such as Al, high thermal conductivity ceramic, etc.

Incidentally, the insulating base substrate 6 may be made of sintered of silicon carbide (SiC) having high thermal conductivity in place of AlN. The thermal expansion coefficient of the high thermal conductivity SiC sinter, which is $3.7 \times 10^{-6}/°C.$, is nearly equal to that of silicon which is a material of the chip 1 so that the SiC sinter can be connected with the chip 1 with high reliability. And the thermal conduction coefficient thereof is as high as 20 w/m·k, which reduces the heat resistance of the package. Other materials may also be employed as long as they are an insulating material having a thermal expansion coefficient nearly equal to silicon and a sufficiently high thermal conduction coefficient.

The insulating cap substrate 8 has through-hole conductive layers 4 and outer connection terminal pins 5 fixed thereonto; the through-hole conductive layers 4 are formed by making through-holes in a green sheet of AlN powder compound, injecting paste tungsten into the through-holes and also baking them; and the outer connection terminal pins 5 are made of Koval. An alumina ($Al_2O_3$) sinter, in which the conductive part can be formed, can be employed in place of the above AlN powder compound.

In view of reliability in the airtightness of the package, it is desired that the insulating base substrate 6 and the insulating cap substrate 8 have nearly equal thermal expansion coefficients. A combination thereof which provides the highest reliability in the airtightness of the package among the materials mentioned above is that of the insulating base substrate 6 and the insulating cap substrate 8 both being made of AlN.

The electric connection of the package is made in the following manner. The chip 1 is connected with wiring electrode part (not shown) on the insulating base substrate 6 by means of wire bondings 2, etc. The electric connection is made through wiring extension layers 10 and further from the electrodes at the terminals of the wiring layers 10 on the insulating base substrate to electrode part 11 of the insulating cap substrate 8 through solder bumps. Further, the electric connection continues to pin-like outer connection terminals 5 through through-hole connection layers 4 within the insulating cap substrate 8 which are formed vertically to the base substrate 6. In order to assure the airtightness of the package, the insulating cap substrate 8 incorporating the conductive layers 4 is fixed to the insulating base substrate 6 by a package sealing layer 7 at their peripheral position.

The conductive layers 4 in the insulating cap substrate 8 communicate its front surface with its back surface at the shortest distance so that the propagation delay time can be minimized even if the substrate 8 is made of ceramic having comparatively large permittivity.

The wiring layers 10 are in the following structure. A resin film such as polyimide is formed on an aluminum nitride (AlN) substrate. Aluminum thin films formed on the resin film connect the connection electrodes for the wire bondings 2 at their terminals with the electrodes 11 of the insulating cap substrate 8 for the conductive layers 4. Aluminum used as the wiring material makes low the electric resistance of the package. The wiring material may be, instead of aluminum, any metal having high conductivity such as gold (Au), silver (Ag), copper (Cu), etc.

FIGS. 4a, 4b and 4c are sectional views of the details of the electrode, wire bonding part and sealing part of the package of FIG. 1. A resin layer 14 is formed at the areas other than the electrodes, and a deposited film 13 of titanium (Ti) - platinum (Pt) - gold (Au) is formed on the electrode. As mentioned above, the wiring layer 10 in this embodiment is formed on the resin film 14 having a small permittivity so that the propagation delay time is short. The resin layer 14 is made of polyimide system resin. The permittivity of this layer is 3.5 or less, preferably 3 or less. As long as the surface of the insulating base substrate 6 has sufficient smoothness, the deposited film 13 may be formed for wiring without providing the resin film 14.

A solder 20 in a ball shape is formed on the deposited film 13. This solder 20 can be provided by melting solder embedded in gap portion of a heat-resistant substrate having poor wettability for solder so as to be transferred thereto. Thus, by using the gap portion corresponding to the portion where the solder is provided on the base substrate, the solder 20, can be formed at a predetermined position. The size of the solder 20 can be changed by controlling the thickness of the heat-resistant substrate.

The solder 20 is previously provided on the base substrate 6 or the cap substrate. The base substrate 6 and the cap substrate 8 are aligned to each other and bonded by the sealing solder 7.

Figure 5:
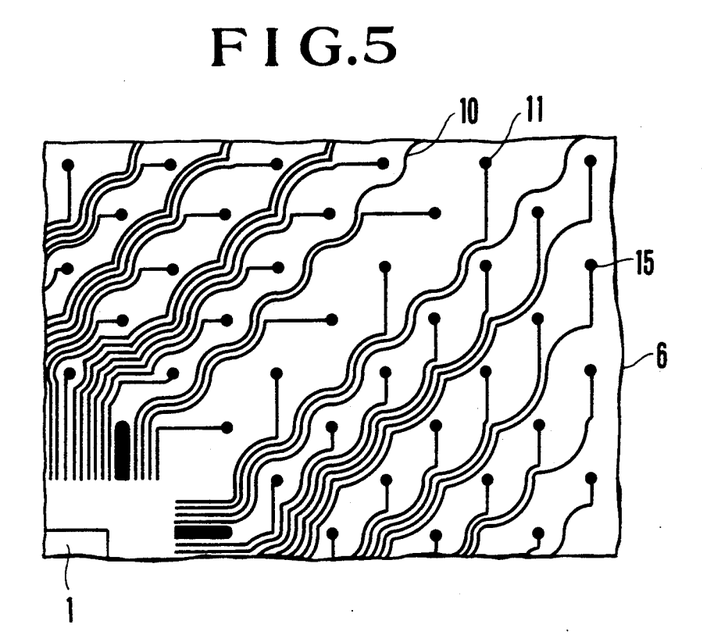
FIG. 5 is a plan view of the pattern of wiring layers formed on a base substrate.

FIG. 5 is a plan view partially showing the pattern of the wiring layer 10 on the insulating base substrate 6. In this embodiment, 400 wiring layers are arranged to provide the same pattern at each of four sides of the region where the chip 1 is mounted. A plurality of columns or groups of the wiring layers are arranged; each group consists of regularly arranged plural wiring layers having different wiring lengths. Also, 400 electrodes 11 are arranged in seven columns.

In the package in the structure mentioned above, heat generated in the chip 1 conducts to the insulating base substrate 6 of AlN through the chip fixing layer 3. The heat disperses in the substrate 6 and conducts to the fin 9 bonded to the substrate 6 thereby to be radiated therefrom. The path of heat conduction is so short that the package of this embodiment is suitable to mount a bipolar ECL chip consuming a large electric power, etc.

The outer connection terminal pins 5 are made of Koval (an alloy of Fe-29 Ni-17 Co). The thermal expansion coefficient of Koval, which is $4.5 \times 10^{-6}/°C$, is nearly equal to that of AlN. Thus, all the components of the package in this embodiment have a thermal expansion coefficient nearly equal to that of silicon so that thermal fatigue due to differences among the thermal expansion coefficients of the members of the package does not occur anywhere in the package.

As mentioned above, the insulating cap substrate 8 is prepared by making through-holes in a green sheet of a sinter mainly of AlN, injecting paste of powder of tungsten, molybdenum, etc. in the through-holes and baking the green sheet. The through-holes are formed at the areas corresponding to the electrodes 11 provided in the cap substrate 8. Formed at these areas are deposited films having high solder-wettability and also formed at the sealing parts are deposited films. Further, solder 20 is bonded onto these deposited films. Prior to sealing the cap substrate 8, the pins 5 mentioned above are connected to the cap substrate 8 by brazing, etc. at the temperature where the brazing metal is not melted at the subsequent sealing temperature.

The cap substrate 8 is fixed to the base substrate 6 so that the chip 1 and the wiring layers 10 are protected from the open air in such a manner that the electrodes and the upper portion of the chip 1 are made integral.

The chip 1 and the electrodes 11 of the base substrate 6 are wire-bonded. The wirings 2 may be metallic wires having a high conductivity such as Au, Al, Cu, etc. The wirings 2 may have a diameter of 100 $\mu$m or less, preferably 30–50 $\mu$m. Ball bonding (the tip is ball-shaped) is made for the chip 1 while wedge bonding is made for the electrodes. These bondings are performed through pressure-welding by ultrasonic vibration.

Although in this embodiment, the base substrate 6 and the cap substrate 8 are sealed by a single sealing part 7, they may be sealed by double or triple sealing parts whereby the airtightness of the package can be further improved.

The package in this embodiment may be fabricated in the following process. The chip 1 is mounted on the insulating base substrate 6. The wiring layers 10, the sealing solder 7 and solder 20 for connection of the electrodes 11 are formed. Thereafter, the chip 1 and the wiring layers are connected with each other by the wirings 2. The insulating cap substrate 8 on which the pins for connection of outer terminals are previously provided is connected with the wiring layers 10. The sealing solder 7 and the solder at the electrode parts may be provided in the insulating cap substrate 8. Since these solders have different sizes, it is desired that the sealing solder 7 is provided in one of both substrates while the electrode part solder 20 is provided in the other thereof. The cooling fin 9 may be bonded to the base substrate 6 using resin bonding agent, solder, etc. after the package has been assembled.

EMBODIMENT 2

Figure 6:
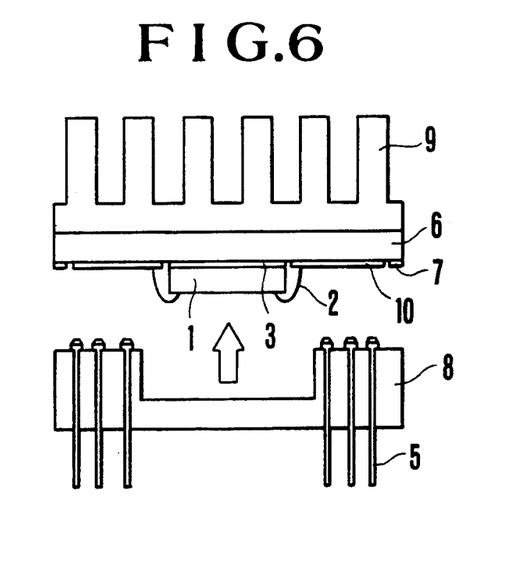
FIG. 6 is a sectional view of the other package structure in accordance with the present invention.
Figure 7:
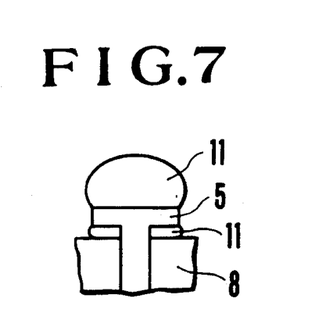
FIG. 7 is a sectional view of the pin connection part in FIG. 6.

FIG. 6 is a sectional view of a package of a second embodiment of the present invention. This embodiment also is a cavity-down type package structure like the first embodiment. The insulating base substrate 6 and the insulating cap substrate 8 are made of a sinter of silicon carbide (SiC) having high thermal conductivity containing BeO of 2% or less by weight. The chip 1 is fixed to the insulating base substrate 6. The structure on the insulating base substrate 6 side is the sam as the first embodiment. The insulating cap substrate 8 must be provided with conductive layers within it. Then, if SiC having high thermal conductivity is to be used as a material of the insulating cap substrate 8, the sintering temperature is too high so that conductive layers can not be provided within the sinter. In order to solve this problem, in accordance with this embodiment, the insulating cap substrate 8 having the following structure is proposed. Through-holes are provided at the portions corresponding to the electrodes at the wiring terminals on the insulating cap substrate 8. The pins 5 each with a T-shape head to both (front and back) surfaces of which a brazing material such as solder is applied is passed through the through-holes and fixed as seen from FIG. 7 which shows an enlarged view of a part of the pin fixing portion. As in the first embodiment, the insulating cap substrate 8 having such a structure is fixed to the insulating base substrate 6 in such a manner that the brazing material applied to the heads of the pins 5 is fixed to the electrodes on the insulating base substrate 6 together with their periphery. In this way, by inserting the conductive material such as a brazing material, bump, etc. between the insulating base substrate 6 and the insulating cap substrate 8, the structure of the insulating cap substrate can be simplified and the sinter of SiC having a high thermal conductivity, which can not be multi-layered, can be adopted as a material of the cap substrate 8. The thermal conduction coefficient of SiC having a high thermal conductivity is twice as large as aluminum nitride (AlN), thereby providing good heat resistance to the package. Further, since both substrates 6 and 8 are made of the same material, the reliability in the airtightness of the package can also be improved.

Also in this embodiment, the wiring layers 10, the sealing part, the electrodes and the wire bonding parts for the insulating base substrate 6 can be formed in the same manner as in the first embodiment. The fin 9 made of metal can also be provided in the same manner.

EMBODIMENT 3

Figure 8:
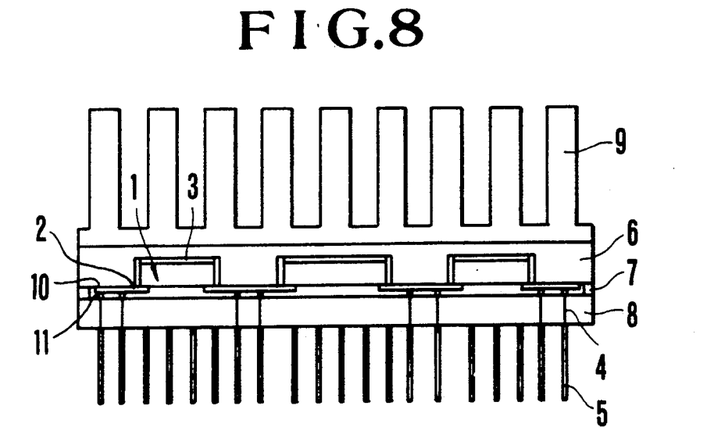
FIG. 8 is a sectional view of a semiconductor package incorporating semiconductor devices in accordance with the present invention.
Figure 9:
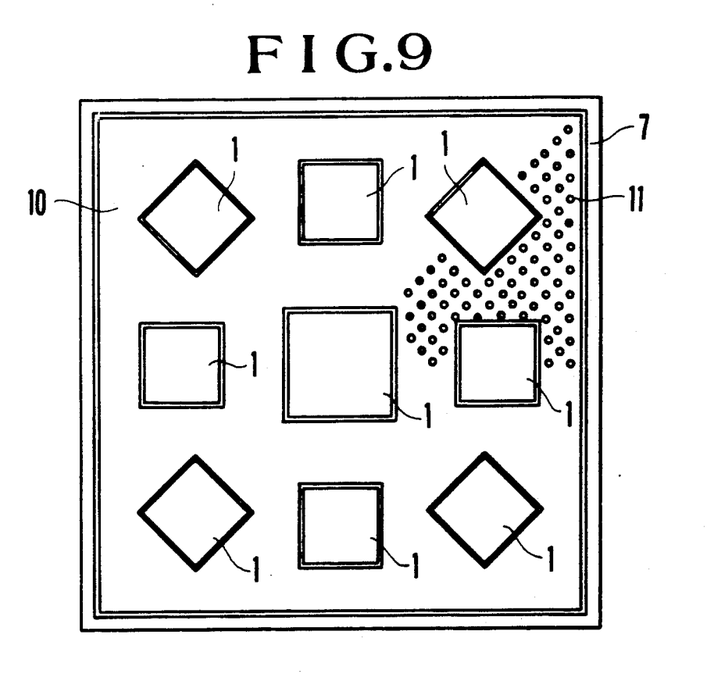
FIG. 9 is a plan view of the electrode part in FIG. 8.

FIG. 8 shows a sectional view of a third embodiment of the present invention. FIG. 9 is a plan view of the insulating base substrate 6 viewed from the chip side before the insulating cap substrate 8 is provided. The package of this embodiment is also in a cavity-down type structure.

Nine (9) chips 1 (including some small-sized chips and some large-sized chips) are fixed to the insulating base substrate 6. In accordance with the use of the package, the number of the chips may be increased or some chips may be exchanged. FIG. 9 shows the insulating base substrate 6 on which a CPU is centrally mounted and memories are mounted in the periphery.

The insulating base substrate 6 and the insulating cap substrate 8 are made of a sinter of aluminum nitride (AlN). By baking a green sheet of a plate made of AlN powder and another green sheet having openings where the chips are to be mounted in such a state that they are stacked, the insulating base substrate 6 having recesses where the chips are to be mounted is prepared. The chips 1 are mounted in the recesses, and the electrodes on the side of each chip and those of the wiring layers 10 of the base substrate around the chip are connected with each other by means of film carriers 2. The reason why the film carriers 2 are employed is that since the insulating cap substrate 8 is constructed as a sheet considering kinetic property relative to the large-scaling of the package, the gap between both substrates 6 and 8 is as small as the diameter of the solder bumps 11 at the areas of connecting both substrates so that the connection between the chips and the wiring layers can not be carried out by the wire bonding technique.

The wiring structure for electric connection starting from the electrodes at the terminals of the wiring layers 10 on the base substrate around the chips 1 is the same as that in the first embodiment. The electric connection is made through the wiring layers 10 (the wiring pattern is not shown) and further made from the electrodes at the terminals of the wiring layers on the insulating base substrate 6 to the electrodes in the insulating cap substrate through the solder bumps 11 at the areas connecting both substrates. The electric connection continues to outer connection terminal pins 5 via the conductive layers 4 formed in the insulating cap substrate 8 which are vertical to the base substrate 6. The solder bumps 11 are provided on the entire surface of the base substrate 6 other than the areas of the chips 1 (although not shown).

The insulating cap substrate 8 is prepared in the same manner as in the first embodiment 1. Namely, the insulating cap substrate 8 is prepared by baking a green sheet of AlN together with paste of tungsten injected into the through-holes provided in the green sheet and fixing outer connection terminal pins 5 to the through-hole conductive layers.

The air tightness of the package can be improved since the insulating base substrate 6 and the insulating cap substrate 8 are made of the same material. The conductive layers 4 in the insulating cap substrate 8 communicate its front surface with its back surface at the shortest distance so that the propagation delay time can be minimized even if the substrate 8 is made of ceramic having a comparative large permittivity.

The wiring layers 10 are provided in the same construction as those in the first embodiment. In the case where a plurality of chips are incorporated in one package as in this embodiment, signal communication is performed also among the chips through wirings. Thus, the wiring pattern to be used is made complicated.

However, in accordance with this embodiment, if the wiring pattern design is to be changed, it can be performed only by changing the wiring pattern without changing the insulating base substrate 6 and the insulating cap substrate 8, so that the wiring pattern can be easily designed.

The solder bumps 11 are commonly used for each wiring layer 10 from each chip 1. Thus, the wiring structure is such that the solder bumps 11 necessary for each chip are not provided individually but commonly used for each chip.

In the package having the structure mentioned above, heat generated in the chips 1 propagates to the insulating base substrate 6 of AlN through the corresponding fixing layers 3. The heat spreads in the insulating base substrate 6 and propagates to the fin 9 so as to be radiated therefrom. In this way, the heat conduction path is so short that the cooling efficiency of the package is improved. Thus, it is possible to incorporate some chips having low heat resistance and some chips producing a large amount of heat in the same package. Therefore, the package of this embodiment has an improved operation processing capability as compared with the combination of the packages in each of which a single chip is incorporated.

EMBODIMENT 4

Figure 10:
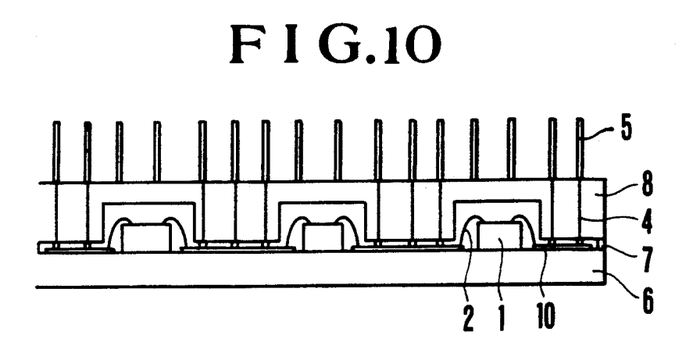
FIG. 10 is a sectional view of a semiconductor package in accordance with the present invention in which plural semiconductor devices are mounted on one substrate.

FIG. 10 is a sectional view of a package in which a plurality of chips are incorporated. This embodiment is different from the third embodiment in that the insulating base substrate 6 is in the shape of a plate and wire bondings are made between the chips 1 and the wiring layers 10 as in the first embodiment. The plan structure is as shown in FIG. 9 in which 9 (nine) chips are arranged in such a way that one CPU chip is centrally arranged and the remaining eight memory chips are arranged in the periphery. Also in this embodiment, the wiring pattern can be made so that the solder bumps necessary for each chip can be commonly used. A cooling fin (not shown) may be also provided.

Also in this embodiment, the conductive layers 4 are provided in the cap substrate 8 at the shortest distance so that the signal propagation delay time is reduced and the high speed operation can be realized.

EMBODIMENT 5

Figure 11:
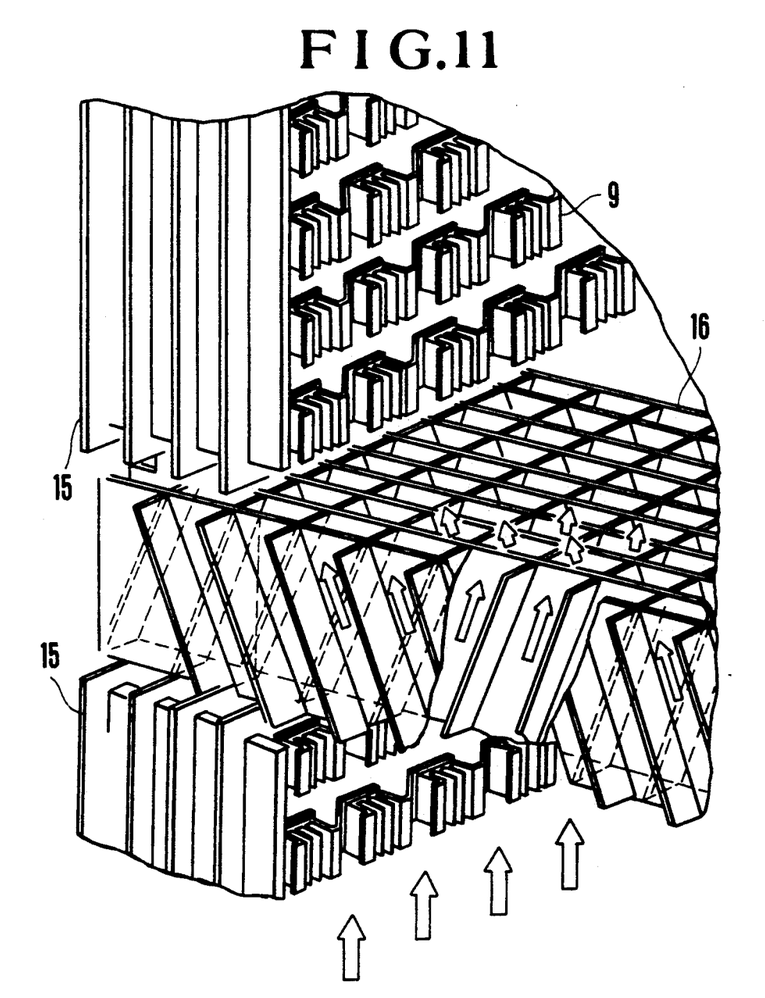
FIG. 11 is a perspective view of a computer in which the semiconductor package of the present invention is incorporated.

FIG. 11 is a perspective view of a super computer in which the semiconductor packages of the present invention are packaged. The semiconductor packages in accordance with the first to the fourth embodiment are three-dimensionally mounted in a multi-layer printed boards 15 and connected with platters by means of connectors. The platter structure is constituted by two stages of an upper platter and lower platter from the bottom of which cooling air is supplied. A cross-free-grid 16 is provided between both platters so as to eliminate temperature dispersion due to the cooling.

The semiconductor packages including a package for logic, a package for VR (vector register), a package for main storage, and a package for extension storage are packaged in highly integrated logic platters. The package for logic incorporates a logic LSI chip or RAM module; the package for VR incorporates a logic LSI chip or VRLSI chip; the package for main storage incorporates a MS (main storage) module; and the package for extension storage incorporates a DRAM (dynamic random access memory). These packages are packaged in a printed board by means of the techniques of surface packaging, axial packaging, both-surface-packaging, etc. This embodiment permits a super computer of the highest speed to be realized.

EMBODIMENT 6

Figure 12:
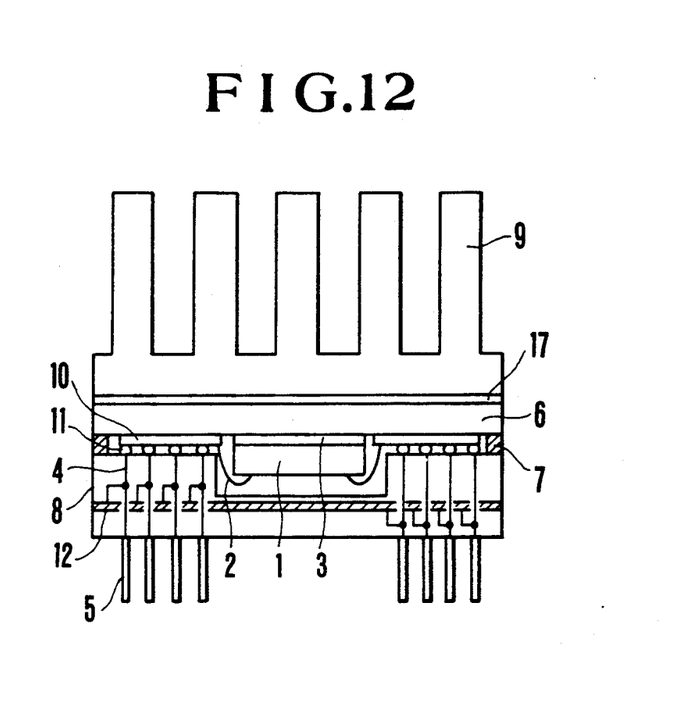
FIGS. 12 and 13 are a sectional view of a semiconductor package in accordance with the present invention in which passive elements are formed in a sealing cap, respectively.

FIG. 12 is a sectional view of the cavity-down type package structure in accordance with the present invention. In FIG. 12, a chip 1 is fixedly attached to an insulating base substrate 6. The insulating base substrate 6 is made of a sinter of aluminum nitride (AlN). The insulating cap substrate 8 is made of glass ceramic. The thermal expansion coefficient of AlN, which is $3.4 \times 10^{-6}/°$C., is nearly equal to that silicon which is a material of the chip 1. Therefore, the base substrate 6 can be connected with the chip with high reliability. Also the thermal conduction coefficient of AlN is as comparatively large as 150 w/m·k. Thus, the heat generated in the chip 1 can be sufficiently conducted to a fin 9 through a fin bonding layer 17.

Incidentally, the insulating base substrate 6 may be of sinter of silicon carbide (SiC) containing Be or BN, which has a high thermal conductivity, in place of AlN. The thermal expansion coefficient of the high thermal conductivity SiC, which is $3.7 \times 10^{-6}/°$C., is nearly equal to that of silicon so that the SiC sinter can be connected with the chip 1 with high reliability. And the thermal conduction coefficient thereof is as high as 270 w/m·k, which reduces the heat resistance of the package. The other materials may also be employed as long as they are an insulating material having a thermal expansion coefficient nearly equal to silicon and a sufficiently high thermal conduction coefficient.

The insulating cap substrate 8 of glass ceramic is a multi-layer substrate incorporating passive elements such as capacitors, resistors, inductances, etc. The insulating cap substrate 8 is prepared by forming through-holes in a green sheet of glass ceramic, baking the green sheet together with conductive material (e.g. Au, Ag, Cu) injected into the through-holes so as to provide conductive layers an fixing outer connection terminal pins of Koval to the conductive layers. Any other material, which permits passive elements and conductive layers to be provided in the cap substrate, can be employed in place of the above glass ceramic.

In view of reliability in the airtightness of the package, it is desired that the insulating base substrate 6 and the insulating cap substrate 8 have nearly equal thermal expansion coefficients. A combination thereof which provides the highest reliability in the airtightness of the package among the materials mentioned above is that of the insulating base substrate 6 of AlN as in the first embodiment and the insulating cap substrate 8 of glass ceramic containing borosilicate glass, which has a thermal expansion coefficient near to that of AlN.

The electric connection of the package is made in the following manner. The chip 1 is connected with the electrodes (not shown) on the insulating base substrate 6 by means of wire bondings 2, TAB (Tape Automated bonding), or the like. The electric connection is made through wiring extension layers 10 and further from the electrodes at the wiring terminals on the insulating base substrate 6 to electrodes of the insulating cap substrate 8 through the solder bumps 11. Further, the electric connection continues to pin-like outer connection terminals 5 through the conductive layers 4 within the insulating cap substrate 8 which are formed vertically to the base substrate 6. The capacitors 18 are connected with the conductive layers 4 in parallel to chip power supply terminal layers and ground layers. The capacitors 18, which are incorporated in the cap substrate 8, can reduce abrupt voltage variation in the neighborhood of the chip 1 and also shorten the wiring length of the circuit as compared with capacitors provided externally of the package. Thus, the quality of the transmission waveform can be improved and the transmission time can be reduced.

In order to assure the airtightness of the package, the insulating cap substrate 8 incorporating the conductive layers 4 is fixed to the insulating base substrate 6 by package sealing layer 7 at the peripheral position.

The conductive layers 4 in the insulating cap substrate 8 communicate its front surface with its back surface so that the propagation delay time can be minimized even if the cap substrate 8 is made of ceramic having a comparatively large permittivity.

The wiring extension layer 10 is in the same structure as the first embodiment.

In the package in the structure mentioned above, heat generated in the chip 1 is conducted to the insulating base substrate 6 of AlN through the chip fixing layer 3. The heat disperses in the substrate 6 and is conducted to the fin 9, which is bonded to the substrate 6 through a fin bonding layer 13 made of high thermal conductivity resin, etc., thereby to be radiated therefrom. The path of heat conduction is so short that the package of this embodiment is suitable to mount a bipolar ECL chip consuming a large electric power, etc.

The outer connection terminal pins 5 are made of Koval (an alloy of Fe-29 Ni-17 Co). The thermal expansion coefficient of Koval, which is 4.5, is nearly equal to that of glass ceramic. Thus, all the components of the package in this embodiment have a thermal expansion coefficient nearly equal to that of silicon so that thermal fatigue due to differences among the thermal expansion coefficients of the members of the package does not occur anywhere in the package.

EMBODIMENT 7

Figure 13:
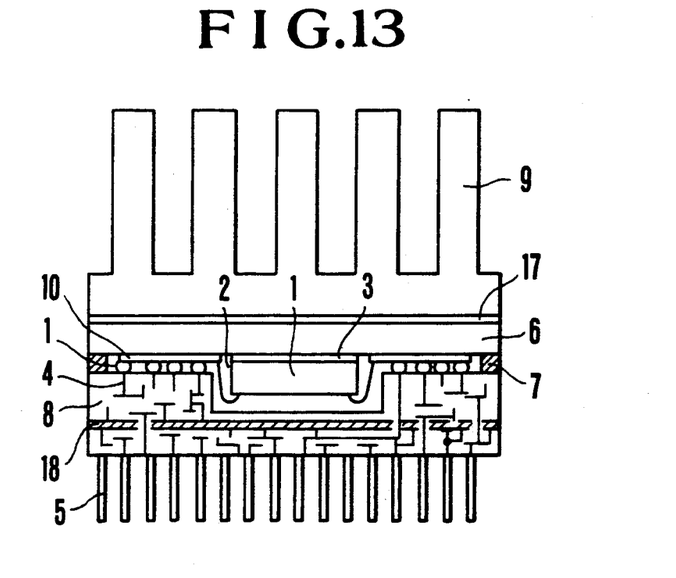

FIG. 13 is a sectional view of a cavity-down type package of the present invention. The insulating base substrate 6 has the same structure and is made of the same material as in the first embodiment. The size of the chip is increased as the number of terminals from the chip 1 is increased. Then, in accordance with this embodiment, in order for the outer connection terminals to be also provided at the area of the insulating cap substrate 8 which is located immediately below the chip 1, the insulating cap substrate 8 incorporates passive elements and the conductive layers 4 are multi-layer-wired. Thus, even if the number of terminals from the chip 1 is increased, the outer connection terminals can be provided onto the entire outer surface of the insulating cap substrate 8 so that the size of the package can be minimized.

We claim:

1. A semiconductor package comprising:
an insulating base substrate on which a semiconductor device is mounted and wherein wiring layers are mounted on a surface of the insulating base substrate, said wiring layers having electrodes, no wiring being formed within said base substrate;
an insulating cap substrate sealing said semiconductor device and the wiring layers so as to protect them from the atmosphere, and wherein said semiconductor device is located in a cavity formed in at least one of the base substrate and the cap substrate;
terminals for outer connection provided on the outer surface of said insulating cap substrate;
electrodes provided on the inner surface of said insulating cap substrate, which are electrically connected with said terminals with a minimum distance for outer connection; and
conductive members connecting the electrodes of said wiring layers on the insulating base substrate with said electrodes provided on the inner surface of said cap substrate, whereby the package has a high transmission speed characteristic.

2. A semiconductor package comprising:
an insulating base substrate on which a semiconductor device is mounted and on which wiring layers are mounted so as to extend along a surface of the base substrate, no wiring being formed within said base substrate;
an insulating cap substrate sealing said semiconductor device and the wiring layers so as to protect them from the atmosphere; and
electrodes provided on said wiring layers so as to connect with minimum distance with terminals provided on said insulating cap substrate for outer connection, said electrodes having patterns corresponding to the terminals of said insulating cap substrate and said electrodes including a plurality of columns of electrodes regularly arranged on said wiring layers of the base substrate, whereby the package has a high temperature speed characteristic.

3. A semiconductor package comprising:
an insulating base substrate on which a semiconductor device is mounted and on which wiring layers are mounted, no wiring being formed within said base substrate;
an insulating cap substrate sealing said semiconductor device and the wiring layers so as to protect them from the atmosphere, said semiconductor device being located in a cavity formed in at least one of the base and cap substrates; and
said wiring layers being arranged with different lengths and at regular intervals, a plurality of columns thereof being regularly arranged, and said wiring layers being connected with minimum distance with terminals for outer connection provided on the outer surface of the insulating cap substrate whereby the package has a high transmission speed characteristic.

4. A semiconductor package comprising:
an insulating base substrate on which a semiconductor device is mounted and on which wiring layers are mounted so as to extend along a surface of the base substrate, no wiring being formed within said base substrate, and electrodes being provided on said wiring layers; p1 an insulating cap substrate sealing said semiconductor device and the wiring layers with electrodes so as to protect them from the atmosphere, said semiconductor device being located in a cavity formed in at least one of the base and cap substrates, said insulating cap substrate including inner wiring; and
connection pins bonded to said inner wiring formed within said cap substrate, said inner wiring being electrically connected to the electrodes on the wiring layers, and said inner wiring extending through said insulating cap with minimum distance whereby the package has a high transmission speed characteristic.

5. The semiconductor package according to claim 1, wherein the electrodes on the inner surface of the cap substrate are electrically connected with the terminals on the outer surface of the cap substrate by conductive layers made by filling conductive paste in through-holes provided within said cap.

6. The semiconductor package according to claim 2, wherein said wiring layers are arranged with different lengths and at regular intervals, a plurality of columns thereof being regularly arranged.

7. The semiconductor package according to claim 1, wherein said wiring layers are provided on a resin layer formed on the insulating base substrate.

8. The semiconductor package according to claim 2, wherein said wiring layers are provided on a resin layer formed on the insulating base substrate.

* * * * *